United States Patent Office 3,424,581

Patented Jan. 28, 1969

3,424,581

PHOTOGRAPHIC EMULSION OF SILVER HALIDE AND DERIVATIZED GELATIN CAPABLE OF CONDUCTING ELECTRICAL CURRENT

George H. Nawn, Westwood, and William J. Timson, Belmont, Mass., assignors to Polaroid Corporation, Cambridge, Mass., a corporation of Delaware No Drawing. Filed Jan. 25, 1966, Ser. No. 522,827
U.S. Cl. 96—38.4 8 Claims
Int. Cl. G03c 5/00

The present invention relates to processes particularly adapted to provide for the fabrication of novel photosensitive elements and, more particularly, to processes adapted to provide for the fabrication of novel photosensitive emulsions which provide, upon development of a latent image impressed thereon, silver images which possess electrical conductivity.

In accordance with the prior art, various photographic techniques have been employed to provide for the fabrication of an electrically conductive pattern, for example, procedures of the type set forth in U.S. Patent No. 2,660,343, which procedures comprise, in general, the preparation of an electrically conductive pattern by initially providing a photographic latent image of the selected conductive pattern, which latent image may be impressed upon a conventional photoresponsive silver halide emulsion by any one of the conventional photographic procedures for this purpose known in the art, as, for example, by contact printing of a photographic negative upon a typical photographic positive emulsion, or projection printing; developing the resultant latent image in the usual manner, but not fixing same; immersing the developed film in a solution which selectively etches, or dissolves, the matrix containing the developed silver image, leaving exposed base material in the predetermined pattern; and then coating a conventional conductive material on the base outlined by the thus-provided stencil. Prior art procedures such as, for example, those disclosed in U.S. Patent No. 3,006,819, comprise a method of forming electrically conducting images, for example, printed circuits and the like, by coating a suitable substrate, sequentially, with a catalytic agent which is a metallic salt having electrical conductivity and a photoresist material; selectively exposing the resist material; removing the exposed areas of the resist material by contact with a solution adapted to dissolve, or etch, the material, in order to provide exposure of the retained metallic salt; and then chemically depositing a conducting metal on the exposed surface of the metallic salt, in order to provide the desired electrically conducting configuration. Procedures of the type disclosed in, for example, U.S. Patent No. 2,854,386, have heretofore been taught as adapted to provide the formation of electrically conducting images by selective exposure of a silver halide emulsion coated substrate, in order to provide impression of a latent image possessing the desired design parameters; developing the resulting latent image; removing the developed image by etching; exposing the remaining photoresponsive silver halide; and then treating the latter exposed silver halide with a solution containing an appropriate silver salt and reducing agent, to provide the desired electrical conducting properties to the resultant image. In further considering existing prior art processes adapted to provide for the production of electrically conducting patterns, attention should also be directed to the plurality of processes disclosed in U.S. Patent No. 3,033,765. The disclosure of that patent sets forth a plurality of methods for accomplishing the purpose of providing an electrically conducting image. For example, a photosensitive photographic paper having a silver chloride content is disclosed to be adapted for chemical development, subsequent to photoexposure, by a monobath treatment which includes employment of a specified class of sulfur-containing organic materials, in order to provide for the formation of an electrically conducting image, in terms of the unexposed regions of the photographic paper. In addition, it is also disclosed that various types of silver halide emulsion coated photographic papers, and specifically those having silver bromide content, may be subjected to development, subsequent to photoexposure, by a monobath treatment and, as a subsequent step, subjected to a nucleating afterbath, containing nucleating agents such as soluble noble metal compounds, for example, gold chloride and the like, tin compounds, for example, stannous chloride and the like, in order to provide formation of an electrically conducting image, in terms of the unexposed regions of the photographic paper. In accordance with the last-mentioned procedure, it is further taught that electrically conducting images may be provided by imagewise diffusion of silver complex from the unexposed areas of the photoexposed photographic paper to a second, or discrete, sheet material, acting as a reception element, and which material possesses an appropriate nucleating agent, or agents, associated with the reception material.

Examination of the prior art methods for producing an electrically conducting image by a photographic technique, such as those described above, indicates that all such processes require the employment of a plurality of individual steps subsequent to the photographic procedure and/or modification of the photographic procedure by the addition of special processing techniques and/or additives in order to produce an electrically conducting image pattern.

Conventional, or normal, development of a typical photoexposed gelatino silver halide photographic emulsion produces a developed silver image, as a function of the point-to-point degree of the emulsion's exposure, which silver image basically comprises conductive metallic silver but which image itself possesses substantially no electrical conductance, that is, the electrical resistivity of the developed silver image produced by a normal photographic development technique of a conventional photoexposed gelatino silver halide photographic emulsion is extremely high, generally, on the order of $10^7$ ohms/cm., or greater. Presumably, this high resistivity is the result of the fact that although the individually developed silver halide grains comprised, in a developed state, conductive metallic silver, such grains are effectively insulated from each other by the gelatin colloid binder in which the silver halide material is dispersed. Specifically, the conventional photographic binder, the universally employed protein gelatin, provides such extensive insulating capacity that, in effect, the metallic silver grains provided upon development of exposed silver halide grains are individually isolated, and thus insulated, for the purposes of efficient, and effective, conduction of electrical energy.

However, for a multiplicity of purposes, it would be extremely desirable to provide photographic silver images, produced by conventional photographic means, that is, by conventional development of a gelatino silver halide emulsion, which are adapted to be directly employed to conduct electrical energy and, more specifically, for certain of the purposes specifically detailed hereinafter.

Accordingly, it is a principal object of the present invention to provide a new and improved procedure particularly adapted to provide for the fabrication of a novel photoresponsive silver halide emulsion which provides, subsequent to photoexposure and conventional development, electrically conducting photographic silver image formation.

Other objects of the invention will in part be obvious and will in part appear hereinafter.

The invention accordingly comprises the process involving the several steps and the relation and order of one or more of such steps with respect to each of the others, and the product possessing the features, properties and the relation of elements which are exemplified in the following detailed disclosure, and the scope of the application of which will be indicated in the claims.

In general, photoresponsive silver halide emulsions are prepared by reacting a water-soluble silver salt, such as silver nitrate, with at least one water-soluble halide, such as ammonium, potassium and/or sodium bromide, preferably together with a corresponding iodide, in an aqueous solution of a peptizing agent, almost universally gelatin; preferably digesting the disperson at an elevated temperature, to provide increased silver halide grain, or crystal, growth; removing undesirable reaction products, residual water-soluble salts, and excess water, for example, by any of the various flocculation systems, or procedures, adapted to effect removal of such undesired components, for example, the procedures described in U.S. Patents Nos. 2,614,928, 2,614,929, 2,728,662, and the like; or, alternatively, solidifying the dispersion, noodling the so set dispersion, and washing the resultant noodles with water; and, preferably, after-ripening the dispersion, most preferably at an elevated temperature and in combination with the addition of various adjuncts, for example, chemical sensitizing agents of U.S. Patents Nos. 1,574,944, 1,623,499, 2,410,689, 2,597,856, 2,597,915, 2,487,850, 2,518,698, 2,521,926, and the like; all according to the traditional procedures of the art, as described in Neblette, C. B., Photography Its Materials and Processes, 6th ed., 1962.

It has now quite unexpectedly been discovered, however, that photoresponsive gelatino silver halide emulsions which provide developed silver images possessing a high degree of electrical conductance, when subjected to development of an impressed latent image, resultant from photoexposure, may be prepared employing the previously detailed procedure wherein the peptizing agent employed comprises a gelatin derivatized as set forth hereinafter and employed in the functional concentration designated.

Specifically, the derivatized gelatin employed must be derivatized in such manner as to convert the amphoteric protein into a proteinaceous material possessing localized negative electrostatic charge. It would appear that normal gelatin, that is, underivatized gelatin, employed as a peptizing agent and colloid binder in the fabrication and structure of a photoresponsive silver halide emulsion adsorbs directly, and uniformly, on the active surfaces, or faces, of the respective silver halide grains, or crystals, comprising the emulsion formulation. This adsorption is generally believed to be at least partially accomplished by an unknown type of chemiadsorption between the crystal surface and the amphoteric protein, as well as by means of electrostatic charge attraction. Specifically, the surface electrostatic chage of the conventional silver halide grain comprises a negative charge per unit area over the total active surface area of the grain, and thus the amphoteric character of the gelatin facilitates, and/or at least allows, the gelatin to be at least in part electrostatically attracted to and maintained directly, and indirectly, on the grain surface, over its total active surface area. However, it has now been specifically found that if a gelatin, which has been derivatized to the extent necessary to provide localized negative electrostatic charge centers in the polymer molecule, is employed as the colloid binder for the silver halide grains, there results, when such derivatized gelatin is adsorbed onto the negative surfaces of the silver halide grain, discontinuities, or irregularities, in the adsorbed gelatin coverage on the surfaces of the silver halide grain, as a result of localized electrostatic charge repulsion. As a result of the presence of the localized discontinuities, or irregularities, in the adsorbed gelatin surface coverage of the silver halide grain, there exist sites on the grain, upon development of a photoexposed photographic emulsion retaining such grains, which provide for the formation of metallic silver filaments extending from such grain and interconnecting directly, and indirectly, with additional grains possessing such sites. The thus produced filamentary network, comprising silver filaments directly, and indirectly, interconnecting the plurality of reduced silver halide grains comprising the developed latent image, constitutes an electrically conducting silver network and, for each emulsion possesses a conductivity proportional to the mean exposure energy quantum incident on the emulsion per unit area.

The derivatized gelatin to be employed in the practice of the present invention may be prepared by any of the conventional derivatizing procedures known in the art for the preparation of derivatized gelatin and which employ derivatizing agents which effect at least neutralization of a portion of the positive electrostatic charges provided to the protein molecule by the respective amino groups of the molecules' amino acid components. As examples of such derivatizing agents, mention may be made of aromatic sulfonyl halides, preferably aromatic sulfonyl chlorides, such as, for examples, benzenesulfonyl chloride, p-methoxybenzenesulfonyl chloride, p-phenoxybenzenesulfonyl chloride, p-bromobenzenesulfonyl chloride, p-toluenesulfonyl chloride, m-nitrobenzenesulfonyl chloride, m-sulfobenzoyl dichloride, naphthalene-β-sulfonyl chloride, p-chlorobenzenesulfonyl chloride, 3-carboxy-4-bromobenzenesulfonyl chloride, 1-chlorosulfonyl-2-hydroxy-3-naphthoic acid, quinoline-8-sulfonyl chloride, n-carboxybenzenesulfonyl chloride, and the like; benzyl halides; carboxylic acid halides, preferably carboxylic acid chlorides, such as, for example, phthalyl chloride, p-nitrobenzoyl chloride, benzoyl chloride, ethylchlorocarbonate, furoyl chloride, methacrylyl chloride, and the like; α-halo-carboxylic acids such as, for example, bromo acetic acid, and the like; acid anhydrides such as, for example, phthalic anhydride, benzoic anhydride, succinic anhydride, maleic anhydride, isatoic anhydride, trimellitic anhydride, acetic anhydride, adipic anhydride, glutaric anhydride, pyromellitic dianhydride, methacrylic anhydride, n-heptyl succinic anhydride, hexahydrophthalic anhydride, and the like; isocyanates such as, for example, phenyl isocyanate, p-bromophenyl isocyanate, p-chlorophenyl isocyanate, p-tolyl isocyanate, p-nitrophenyl isocyanate, α-naphthylisocyanate, β-naphthylisocyanate, and the like; 1,4-diketones such as, for example, acetonyl acetone, dimethyl-acetonyl acetone, diethyl diacetyl succinate, and the like; nitriles such as, for example, acrylonitrile and the like; vinylsulfonamides such as, for example, vinylsulfonic acid anilide, vinylsulfonic acid-p-phenetidide, vinylsulfonic acid-p-toluidide, vinylsulfonic acid-N-methylanilide, and the like; vinylsulfones such as, for example, o-vinylsulfonyl benzoic acid, 1,3-divinylsulfonyl benzene, 1-methyl-4-vinylsulfonyl benzene, 1-methyl-3-vinylsulfonyl benzene, 1,3-dimethyl-4,6-divinylsulfonyl benzene, 1,3,5-dimethyl-4,6-divinylsulfonyl benzene, 1,3,5-trimethyl-4-vinylsulfonyl benzene, 1,3,5,6-trimethyl-4-vinylsulfonyl benzene, Ramasol Red B (trade name of Carbic-Hoechst Corporation, New York, N.Y., for a reactive dye-containing vinylsulfone groups), Hardener D II S (trade name of Carbic-Hoechst Corporation, New York, N.Y., for vinylsulfone hardeners), and the like; halogeno pyrimidines such as, for example, 2,6-dichloropyrimidine, 2-chloropyrimidine, Reactone Black RL, Reactone Red 2B, and the like; halogeno triazines such as, for example 2,4-dichloro-6-(N-sulfanilic acid, sodium salt)-1,3,5-s-triazine, 2-chloro-4,6-bis-(N-glycinic)-1,3,5-s-triazine, Procion Brilliant Red 5B, Printing Green 5G, Procion Brilliant Yellow H5G, Procion Yellow R, Procion Brilliant Red H7B, Procion Scarlet H3G, Procion Brilliant Red 2B, Cibacron Black BG, Cibacron Brilliant Orange G, Cibacron Brilliant Yellow 3G, Cibacron Brilliant Red 3B, Cibacron Brilliant Rubine R, Cibacron Yellow R, Cibacron Scarlet 2G, Cibacron Blue 3G, Cibalan Brilliant Red BL, and the like; maleimides such as, for example, N-phenylmaleimide, N-(p-carboxyphenyl)-maleimide, N-(p-sulfopenhyl)-Maleimide potassium salt, N,N'-(1,2-phenylene)-bis-maleimide, N,N'-(1,3-phenylene)-bis-maleimide, N,N'-hexamethylene-bis-maleimide, N,N'-(1,4-phenylene)-bis-maleimide, N-ethyl-maleimide, N-(carboxymethylene)-maleimide, and the like; maleamic acids such as, for example, N,N'-hexamethylene-bis-maleamic acid, N,N'-(1,3-phenylene)-bis-maleamic acid, N,N'-(1,2-phenylene)-bis-maleamic acid, and the like; etc., as disclosed in U. S. Patents Nos. 2,614,928, 614,-929, 2,614,930, 2,691,582, 2,728,662, 2,768,079, 2,956,-880, 3,061,436, 3,132,945, 3,138,461, 3,186,846, and the like.

Preferred derivatizing agents specifically comprise those agents which provide a negative electrostatic charge in addition to effecting neutralization of the positive electrostatic charge provided by the amino groups of the proteins' amino acid constituent components. As examples of such derivatizing agents, mention may be made of, for example, the preceding enumerated derivatizing agents which contain free acid substituents such as carboxylic and sulfonic acid radicals which effectively complement the electronegativity of the preexistent carboxylic groups of the protein molecules' amino acids.

In general, the derivatized gelatins are formulated by the reaction of the above-identified derivatizing agents with gelatin in an alkaline medium and at a concentration falling within the range of about 1 to 100 grams of derivatizing agent per 100 grams of gelatin. The thus-produced derivatized gelatin is then employed in the fabrication of the photoresponsive silver halide photographic emulsion according to the methods previously detailed in the effective concentration, or ratio, and, specifically, in the proportional amount, or functional ratio, necessitated by the degree of electrical conductivity desired of the resultant developed photographic silver image, and, which, in general, comprises a weight ratio of not less than about 0.1 and not more than about 5.0 parts derivatized gelatin per part silver halide.

Additional optional additives, such as coating aids, hardeners, viscosity-increasing agents, preservatives, accelerators, and the like, for example, those set forth hereinafter, may be incorporated in the emulsion formulation, according to the conventional procedures known in the photographic emulsion manufacturing art.

The photoresponsive crystal material of the photographic emulsion will, as previously described, comprise a crystal of a compound of silver, for example, one or more of the silver halides such as silver chloride, silver iodide, silver bromide, or mixed silver halides such as silver chlorobromide or silver iodobromide, of varying halide ratios and varying silver concentrations. The formulated photographic emulsions may be used for the preparation of orthochromatic, panchromatic, ultraviolet, X-ray, and infrared sensitive photographic films.

The fabricated emulsion may be coated onto various types of rigid or flexible supports, for example, glass, paper, metal, polymeric films of both the synthetic types and those derived from naturally occurring products, etc. Especially suitable materials include paper; aluminum; polymethacrylic acid, methyl and ethyl esters; vinyl chloride polymers; polyvinyl acetals; polyamides such as nylon; polyesters such as the polymeric films derived from ethylene glycol terephthalic acid; polymeric cellulose derivatives such as cellulose acetate, triacetate, nitrate, propionate, butyrate, acetate-butyrate, or acetate-propionate; polycarbonates; and polystyrenes.

The emulsions may include the various adjuncts, or addenda, according to the techniques disclosed in the art, such as speed increasing compounds of the quaternary ammonium type, as described in U.S. Patents Nos. 2,271,623, 2,288,226, and 2,334,864; or of the polyethyleneglycol type, as described in U.S. Patent No. 2,708,162; or of the preceding combination, as described in U.S. Patent No. 2,886,437; or the thiopolymers, as described in U.S. Patents Nos. 3,046,129 and 3,046,134.

Hardening agents such as inorganic agents providing polyvalent metallic atoms, specifically polyvalent aluminum or chromium ions, for example, potash alum $$[K_2Al_2(SO_4)_4 \cdot 24H_2O]$$

and chrome alum $$[K_2Cr_2(SO_4)_4 \cdot 24H_2O]$$

and organic agents of the aldehyde type, such as formaldehyde, glyoxal, mucochloric, etc.; the ketone type such as diacetyl; the quinone type; and the specific agents described in U.S. Patents Nos. 2,080,019, 2,725,294, 2,725,295, 2,725,305, 2,726,162, 2,732,316, 2,950,197 and 2,870,013 may be incorporated in the emulsion.

The emulsion may also contain one or more coating aids such as saponin; a polyethyleneglycol of U.S. Patent No. 2,831,766; a polyethyleneglycol ether of U.S. Patent No. 2,719,087; a taurine of U.S. Patent No. 2,739,891; a maleopimarate of U.S. Patent No. 2,823,123; an amino acid of U.S. Patent No. 3,038,804; a sulfosuccinamate of U.S. Patent No. 2,992,108; or a polyether of U.S. Patent No. 2,600,831; or a gelatin plasticizer such as glycerin; a dihydroxyalkane of U.S. Patent No. 2,960,404; a bis-glycolic acid ester of U.S. Patent No. 2,904,434; a succinate of U.S. Patent No. 2,940,854; or a polymeric hydrosol of U.S. Patent No. 2,852,386.

Optical sensitization of the emulsion's silver halide crystals may be accomplished by contact of the emulsion composition with an effective concentration of the selected optical sensitizing dye, or dyes, dissolved in an appropriate dispersing solvent such as methanol, ethanol, acetone, water, and the like; all according to the traditional procedures of the art, as described in Hamer, F. M., The Cyanine Dyes and Related Compounds (1964), Interscience Publishers, New York, N.Y.

Commensurate with the preceding discussion, it will be recognized that the aforementioned gelatin derivative may be replaced, in part, by nonderivatized gelatin during formulation of a selected emulsion with a concomitant reduction in the electrical conductance of the emulsion directly proportional to the relative amount of nonderivatized gelatin introduced into the emulsion system.

In general, it is believed that the described metallic silver filaments are, at least in part, provided by deposition of silver ions, derived, at least in part, from the continuous dissolution and reconstitution of silver halide crystals, or grains, as metallic silver, in filamentary form, during the development process.

It has been specifically found, however, that gelatino silver halide emulsions formulated in accordance with the present invention are subject to a phenomenon which may be characterized as "spontaneous" or "filamentous infectious" development when the latent image contained in a photoexposed emulsion is subjected to development. Specifically, it has been found that a statistical number of the previously detailed silver filaments interconnect both exposed and unexposed silver halide crystals and initiate thereby development of such unexposed grains, with the concomitant result of a decrease in the potential resolution of the emulsion formulation by reason of the resultant "fog." In point of fact, the silver halide emulsions of the present invention, if not specifically stabilized, for example, as set forth hereinafter, possess sufficient propensity for "infectious" development as to be substantially unacceptable for employment in conventional information storage photographic processes, such as pictorial photography and the like.

It has also been found that, with regard to silver halide emulsions formulated in accordance with the present invention, development can be substantially limited to silver halide crystals which have been exposed and thus development restricted to that of the latent image by the addition of a stabilizing amount of a conventional stabilizer and/or antifoggant. However, the addition of a stabilizing agent to the emulsion formulation provides a decrease in the electrical conductance efficiency of the image, formed upon development, in direct proportion to the stabilization afforded to the formulation by the adjunct. Thus, the concentration of stabilizer employed to provide increased resolution will be directly dependent upon the propensity of the selected emulsion for infectious development and, accordingly, empirically selected, preferably so as to constitute the minimum amount necessary to provide the minimum resolution required by the emulsion formulation's employment. The concentration of such adjuncts, however, when employed, will generally fall within the range of about 5 micrograms to 5 grams of efficient stabilizing adjunct per 100 grams of silver halide.

For an extensive listing of stabilizing adjuncts adapted for employment in the present system, reference is made to Chapter XXI of Photographic Chemistry, volume 1, P. Glafkides, Fountain Press, London, England, and the subject matter commencing at page 677 of The Theory of the Photographic Process (revised edition, 1954), C. E. K. Mees, the MacMillan Company, New York, N.Y.

Specifically, the emulsions may be stabilized with the salts of the noble metals such as ruthenium, rhodium, palladium, iridium, and platinum, as described in U.S. Patents Nos. 2,566,245 and 2,566,263; the mercury compounds of U.S. Patents Nos. 2,728,663, 2,728,664 and 2,728,665; the triazoles of U.S. Patent No. 2,444,608; the azaindines of U.S. Patents Nos. 2,444,605, 2,444,606, 2,444,607, 2,450,397, 2,444,609, 2,713,541, 2,743,181, 2,716,062, 2,735,769, 2,756,147 2,772,164; and those disclosed by Burr in "Z. Wiss. Phot.," line 47, 1852, pages 2–28; the disulfides of Belgian Patent No. 569,317; the benzothiazolium compounds of U.S. Patents Nos. 2,131,-038 and 2,694,716; the zinc and cadmium salts of U.S. Patent No. 2,839,405; and the mercapto compounds of U.S. Patent No. 2,819,965.

The photoexposed emulsion may be developed by any of the conventional developing procedures known in the art to be adapted to effect reduction of the photoexposed silver halide crystal. In general, development will be effected by contact of the photoexposed emulsion with a solution containing a conventional developing agent such as one, or more, of the conventional developing agents, and compositions of same, set forth in Chapter 14 of The Theory of the Photographic Process, supra, and Chapters VI, VII, VIII and IX, of Photographic Chemistry, volume 1, supra. The preferred developing agents generally comprise organic compounds and, in particular, constitute organic compounds of the aromatic series containing at least two hydroxyl and/or amino groups, wherein at least one of the groups is in one of ortho and para position with respect to at least one other of the groups, such as, for example, the various known hydroquinones, p-aminophenols, p-phenylenediamines, and their various known functional analogues. The developing composition will preferably comprise an aqueous solution of an alkaline material such as sodium hydroxide or sodium carbonate or the like containing one or more specific silver halide developing agents, such as p-methylaminophenol; 2,4-diaminophenol; p-benzylaminophenol; hydroquinone; toluhydroquinone, phenyl hydroquinone, 4'-methylphenylhydroquinone, etc. It will be recognized that the developing agent may be initially incorporated in the liquid processing composition and/or incorporated, at least in part, in any one, or more, of the strata constituting the photoresponsive element retaining the emulsion and solubilized by contact with an appropriate fluid medium for effecting development of the photoexposed emulsion. The developing composition may be contacted with the photoexposed emulsion according to any of the conventional tray, tank, and the like, procedures, and may optionally contain preservatives, alkalis, restrainers, accelerators, etc., other than those specifically mentioned hereinbefore. Similarly, the concentration of the various components may be varied over a wide range and, where desirable, any one, or more, of such components may be disposed in the photosensitive element, prior to exposure, in a separate permeable layer of the element and/or in the photosensitive emulsion itself.

For the purpose of stabilizing the developed image, the emulsion may be fixed according to any of the conventional fixing, washing and/or drying procedures known in the art as, for example, those described in Chapter XI of Photographic Chemistry, volume 1, supra, and Chapter 17 of The Theory of the Photographic Process, supra. For example, the element retaining the developed image may be initially contacted with a stop bath adapted to terminate action of the developing agent, on the photosensitive emulsion, by changing the pH to that at which the selected silver halide developing agent exhibits substantially no developing potential. Specifically, where the silver halide developing agent is an organic compound exhibiting its developing action at an alkaline pH, for example, a hydroquinone, or the like, the element may be subjected to an acid stop bath for a sufficient time interval as to neutralize the silver halide developing potential of the selected developing agent. The element may then be subjected to a fixing bath in order to effect removal of unexposed photoresponsive silver halide from the emulsion, according to the conventional procedures known to the art as adapted to effect same. Specifically, the fixing agent generally employed will comprise a sodium thiosulfate bath which is effective to remove substantially all types of silver halides from disposition in the gelatino silver halide emulsion strata and which agent itself does not attack the previously developed silver image. Subsequent to fixation all residual traces of the fixing agent may be removed by aqueous washing, in order to insure permanency of the developed image.

The present invention will be illustrated in conjunction with the following procedures which set out representative embodiments illustrating fabrication and utilization of the photoresponsive elements of the present invention, which, however, are not limited to the details therein set forth and are intended to be illustrative only.

Step 1.—Derivatization of the gelatin

A 10% aqueous gelatin solution, having a pH of about 9.0, was prepared and heated to about 50° C. Over a 30 minute period an amount of trimellitic anhydride equal to about 4%, by weight, of the gelatin was stirred in while maintaining the pH at about 9.0. After the trimellitic anhydride was completely added, the reaction was continued for about 15 minutes while maintaining the temperature and the pH at the initial levels. The solution was then adjusted to a final pH of about 6.0.

Step 2.—Preparation of the photosensitive emulsion

A first solution comprising 3 g. of silver nitrate and 30 ml. of water was added with rapid stirring to a 30 ml. solution containing 5.2 g. ammonium bromide, 0.2 g. potassium iodide and 1.5 g. of the gelatin-trimellitic anhydride derivative prepared in Step 1. After a pause of 5 minutes, a second silver nitrate solution comprising 60 ml. of water and 6 g. of silver nitrate was then added over a period of 30 minutes. The resulting emulsion was precipitated by reducing the pH to 3 with sulfuric acid. The precipitate was then washed until the supernatant water was essentially free of excess ammonium nitrate. 1.5 g. of the gelatin-trimellitic anhydride derivative was then added for after-ripening and the volume was adjusted to 120 ml. The gelatin was dissolved by heating to 35° C. and adjusting the pH to 5.0 and the pAg to 9.0. At this point 0.05 ml. of an 0.1% sodium thiosulfate solution and 0.05 ml. of an 0.1% gold thiocyanate solution were added. The emulsion was ripened at 60° C. for 2 hours and then coated onto a cellulose triacetate support.

Seven additional emulsions were prepared as in Steps 1 and 2 above except that in each case the degree of derivatization of the gelatin was varied by changing the proportions of underivatized gelatin to trimellitic anhydride used in Step 1. For Emulsions 1–8 prepared according to the above outlined technique, the weight of trimellitic anhydride according to Step 1 per 100 grams of underivatized gelatin was 0, 1, 2, 4, 8, 16, 32 and 64 grams, respectively.

Emulsions 1–8 were exposed under identical conditions and circumstances to the same exposure radiation pattern and then developed by contacting each exposed emulsion for 5 minutes at 68° ±1° F. with DK-60A (trade name of Eastman Kodak Company, Rochester, N.Y., for a developer formulation comprising 2.5 g. of p-methylaminophenyl sulfate, 50 g. of sodium sulfite, 2.5 g. of hydroquinone, 20 g. of Kodalk [trade name of Eastman Kodak Company for the alkali forming the subject matter of U.S. Patent No. 1,976,299], 0.5 g. of potassium bromide and sufficient water to provide 1 liter of developer composition). Each emulsion was then short-stopped by contact for 30 seconds, at 68° ±1° F., with a short-stop solution comprising 533 cc. of 28% acetic acid in 3.3 gallons of water and then fixed by contact for 5 minutes, in the dark, followed by 5 minutes, in the light, at 68° ±1° F., with an acid fixing composition comprising 240 g. of sodium thiosulfate, 15 g. of sodium sulfite, 48 cc. of 28% acetic acid, 7.5 g. of boric acid, 15 g. of potassium alum, and sufficient water to provide a composition comprising 1 liter. Each emulsion was then washed for 30 mintues with water and dried by contact with circulating air for 45 minutes, at a temperature of 120° F.

The electrical resistivities of the resultant test and comparative control images prepared above are summarized below in tabular form, in the interest of clarity.

| Emulsion No. | Grams trimellitic anhydride/100 grams gelatin | Resistivity (ohms/cm.) |
|---|---|---|
| 1 | 0 | 1,000,000+ |
| 2 | 1 | 100,000 |
| 3 | 2 | 10,000 |
| 4 | 4 | 3,000 |
| 5 | 8 | 600 |
| 6 | 16 | 150 |
| 7 | 32 | 100 |
| 8 | 64 | 90 |

The electrically conducting silver images or matrices produced in accordance with the practice of the present invention possess specific utility as electronic circuits. Optionally, the matrix may be further strengthened and modified by electro-chemical deposition of the various metallic, preferably electrically conductive, elements such as additional silver, copper, platinum, gold, zinc, cadmium and the like, which in turn will strengthen the matrix as a function of the dimensional stability provided by the selected quantum deposited and property modification in accordance with the respective properties of the element and concentration of same integrated in the matrix. The gelatin in contiguous relationship with the silver matrix may be removed by thermal destruction and/or appropriate solvent contact, for example, solvent contact in the presence of appropriate enzymes adapted to effect in situ destruction and/or removal of the gelatin matrix itself. Optionally, the silver matrix also may be imbibed, or infused, with an insulating substance such as the various silicates, silicones, and the like, prior to and/or subsequent to removal of the gelatin. Fusion and compression of the resultant structure may then be employed to provide a wafer containing the electrically conducting silver matrix for the various utilizations employed in microelectronic circuitry. Where desired, further electronic components such as capacitors, resistors, transistors, and the like, may be incorporated as a constituent component of the electrically conducting silver matrix by appropriate positioning and/or integration prior to formation of the silver matrix itself and/or subsequent to final fabrication of same.

In contradistinction to current printed electronic circuits, produced by present industrial methods, which printed circuits are basically circuits existing in a single plane, the present invention provides a method of simultaneously fabricating a pluraliy of selectively positioned separate and/or integrated electronic circuits in a plurality of planes by the following illustrative procedure. For example, a multilayered element comprising a plurality of the herein described silver halide emulsions, preferably at least two of said emulsions, most preferably in laminate form, may be fabricated as an element wherein any one or more of the respective emulsions is optically (spectrally) sensitized, according to the procedure described above, to electromagnetic radiation of selected wavelengths differing from any one or more of the remaining emulsion units, that is, having predominant spectral sensitivity to separate regions of the electromagnetic spectrum, for example, one or more emulsion units sensitized to the red region of the visible spectrum, one or more emulsion units sensitized to the green region of the visible spectrum, one or more emulsion units sensitized to the blue area of the visible spectrum, and the like. The respective differentially sensitized emulsion components may then be simultaneously and/or sequentially exposed to the selected radiation pattern, corresponding to the particular electronic configuration desired, at the particular radiation wavelengths to which the selected emulsion component desired to be exposed is responsive. The multilayered element then containing the selected plurality of latent images may be developed according to the photographic technique disclosed hereinbefore and the resultant integrated matrix so provided.

Additional applications will occur to those skilled in the various arts to which the present invention relates; accordingly, such applications are intended to be within the spirit and scope of the present invention.

The instant mechanism of "filamentous infectious" development, wherein silver filaments emanating from a developing silver halide crystal induce neighboring grains to undergo development, is to be distinguished from "chemical infectious" development in which silver halide developing agent oxidation products induce development of neighboring grains.

Since certain changes may be made in the above process and product without departing from the scope of the invention herein involved, it is intended that all matter contained in the above description shall be interpreted as illustrative and not in a limitng sense.

What is claimed is:

1. A method of conductng electrical energy which comprises impressing an electrical current on a circuit comprising an electrically conducting silver image prepared by exposing a silver halide element which comprises a dispersion of silver halide crystals distributed in a colloid binder comprisng a derivatized gelatin possessing localized net negative electrostatic charge in a quantum sufficient to prevent substantially complete adsorption of said gelatin to the active face of said crystals and developing said exposed silver halide emulsion with silver halide developing agent for a time sufficient to provide development of the latent image to a silver image and formation of silver filaments interconnecting the silver grains constituting said developed image.

2. A method as defined in claim 1, including the step of removing said gelatin from contact with said developed silver image.

3. A method as defined in claim 1, including the step of replacing said gelatin with an insulating material.

4. A method as defined in claim 3, including the step of fusing and compressing the product thereof.

5. A method as defined in claim 1, including the step of electrochemically plating an electrically conductive metal on said silver image.

6. A method as defined in claim 5 wherein said electrically conductive metal is copper.

7. A method as defined in claim 1, wherein said derivatized gelatin comprises the reaction product of gelatin and a derivatizing agent at a concentration within the range of about 1 to 100 grams of derivatizing agent per 100 grams of gelatin.

8. A method as defined in claim 1, wherein said derivatized gelatin is present in a weight ratio within the range of about 0.1 to 5.0 parts derivatized gelatin per part silver halide.

References Cited

UNITED STATES PATENTS

| | | | |
|---|---|---|---|
| 2,868,124 | 4/1956 | Crawford | 96—36.2 X |
| 3,061,436 | 10/1962 | Himmelmann et al. | 96—94 |
| 3,132,945 | 5/1964 | Ryan | 96—94 |
| 3,138,461 | 6/1964 | Ryan | 96—94 |
| 3,186,846 | 6/1965 | Ryan | 96—94 |
| 3,223,528 | 12/1965 | Rancken et al. | 96—94 |

FOREIGN PATENTS

| | | |
|---|---|---|
| 776,343 | 6/1957 | Great Britain. |

NORMAN G. TORCHIN, *Primary Examiner.*

R. E. MARTIN, *Assistant Examiner.*

U.S. Cl. X.R.

96—36.2